US007589333B2

(12) United States Patent
Graf et al.

(10) Patent No.: US 7,589,333 B2
(45) Date of Patent: Sep. 15, 2009

(54) METHODS FOR RAPIDLY SWITCHING OFF AN ION BEAM

(75) Inventors: Michael A. Graf, Belmont, MA (US); Edward C. Eisner, Lexington, MA (US); William F. DiVergilio, Brookline, MA (US); Daniel R. Tieger, Manchester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 350 days.

(21) Appl. No.: 11/540,449

(22) Filed: Sep. 29, 2006

(65) Prior Publication Data

US 2008/0078955 A1 Apr. 3, 2008

(51) Int. Cl.
*H01J 37/317* (2006.01)
*H01J 37/256* (2006.01)

(52) U.S. Cl. .............................. 250/492.21; 250/492.3; 250/427; 250/309; 315/111.81; 438/514

(58) Field of Classification Search ................. 250/309, 250/423 R, 423 F, 423 P, 424, 425, 427, 492.1, 250/492.2, 492.21, 492.23, 492.3; 315/111.01, 315/111.21, 111.71, 111.81, 111.91; 438/514
See application file for complete search history.

(56) References Cited

U.S. PATENT DOCUMENTS

| | | | |
|---|---|---|---|
| 5,306,921 A | 4/1994 | Tanaka et al. | |
| 5,661,308 A | 8/1997 | Benveniste et al. | |
| 6,060,718 A | 5/2000 | Brailove et al. | |
| 6,169,015 B1* | 1/2001 | Fu-Kang | 438/510 |
| 6,452,338 B1 | 9/2002 | Horsky | |
| 6,661,016 B2 | 12/2003 | Berrian | |
| 6,686,595 B2 | 2/2004 | Horsky | |
| 6,777,699 B1 | 8/2004 | Miley et al. | |
| 6,965,116 B1* | 11/2005 | Wagner et al. | 250/492.21 |
| 7,022,999 B2* | 4/2006 | Horsky et al. | 250/427 |
| 7,064,491 B2 | 6/2006 | Horsky et al. | |
| 7,473,909 B2* | 1/2009 | Berry, III | 250/492.21 |
| 2002/0053642 A1 | 5/2002 | Berrian | |
| 2004/0188631 A1* | 9/2004 | Horsky et al. | 250/423 R |
| 2005/0051096 A1* | 3/2005 | Horsky et al. | 118/723 CB |
| 2005/0181584 A1 | 8/2005 | Foad et al. | |
| 2006/0272775 A1 | 12/2006 | Horsky et al. | |
| 2008/0067433 A1* | 3/2008 | Weiguo et al. | 250/492.21 |
| 2008/0078955 A1* | 4/2008 | Graf et al. | 250/492.21 |
| 2008/0078957 A1* | 4/2008 | Graf et al. | 250/492.21 |
| 2008/0128621 A1* | 6/2008 | Berry | 250/338.1 |

OTHER PUBLICATIONS

Office Action dated Oct. 3, 2008 in connection with U.S. Appl. No. 11/541,087.
Office Action dated Mar. 23, 2009 in connection with U.S. Appl. No. 11/541,087.

* cited by examiner

*Primary Examiner*—Bernard E Souw
(74) *Attorney, Agent, or Firm*—Eschweiler & Associates, LLC

(57) ABSTRACT

An ion beam is rapidly switched off during ion implantation on detecting a beam instability. The ion beam is generated or provided by a non-arc discharge based ion source, such as an electron gun ion source or an RF ion source. The ion beam is scanned across a workpiece from a starting location toward an ending location. During the scanning, one or more beam characteristics are monitored, such as beam current, beam flux, shape, and the like. An instability is detected when one or more of the beam characteristics deviate from acceptable values or levels. The ion beam is rapidly turned off on the detected instability.

19 Claims, 11 Drawing Sheets

METHODS FOR RAPIDLY SWITCHING OFF AN ION BEAM

FIELD OF THE INVENTION

The present invention relates generally to ion implantation systems, and more specifically to improved systems and methods for uniformly scanning ion beams across a workpiece.

BACKGROUND OF THE INVENTION

In the manufacture of semiconductor devices and other products, ion implantation is used to dope semiconductor wafers, display panels, or other workpieces with impurities. Ion implanters or ion implantation systems treat a workpiece with an ion beam, to produce n or p-type doped regions or to form passivation layers in the workpiece. When used for doping semiconductors, the ion implantation system injects a selected ion species to produce the desired extrinsic material, wherein implanting ions generated from source materials such as antimony, arsenic or phosphorus results in n-type extrinsic material wafers, and implanting materials such as boron, gallium or indium creates p-type extrinsic material portions in a semiconductor wafer.

Ion beams employed in ion implantation systems typically have a smaller cross-sectional area than a substrate or wafer to be implanted. In order for the ion beam to completely cover the wafer, the ion beam and/or the wafer are moved relative to one another in order to scan the entire wafer surface. In one example, an ion beam is deflected so as to scan across a wafer, which is held in place. In another example, an ion beam remains fixed while a wafer is mechanically moved to allow the ion beam to scan across the wafer. In yet another example, the ion beam is scanned in a fast/horizontal direction while the wafer is mechanically moved in a slow/vertical direction.

Serial ion implantations generally operate on a single wafer at a time. Relative motion between an ion beam and wafer is effected so that the ion beam traces a raster pattern on the wafer surface. Typically, there is an amount of overlap between adjacent scan lines to facilitate uniform implantation.

However, instabilities in ion beams themselves can lead to non-uniform implantations. The instabilities can result from a number of sources, such as contamination on interior surfaces causing unwanted discharges in an ion source, and the like. As a result of the instabilities, a glitch can occur wherein a flux of the ion beam drops within a short period of time. The drop or change in flux leads to areas of the wafer receiving a lower level of doping, which can result in degraded or faulty devices. Additionally, an increase in flux can lead to areas of a wafer surface receiving a higher level of doping, which can also result in degraded or faulty devices.

For beam deflection based scanning systems or fixed beam systems with scanning wafer(s), multiple passes are generally made over each region of the wafer in order to obtain a sufficient dosing. An error in even a single pass results in an unwanted dose variation for the affected region.

A conventional mechanism exists for switching off an arc discharge source on detected ion beam instabilities. However, the mechanism is limited to arc discharge sources and requires a specific circuit limited to arc discharge sources.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

Aspects of the present invention facilitate ion implantation by detecting ion beam instabilities and mitigating non-uniform implantations. An ion beam generated by a non-arc discharge ion source can be rapidly switched off after detecting an instability and allow a controlled recovery and avoid a non-uniform dose for implantation.

In accordance with one aspect, an ion beam is rapidly switched off during ion implantation on detecting a beam instability. The ion beam is generated or provided by a non-arc discharge based ion source, such as an electron gun ion source or an RF ion source. The ion beam is scanned across a workpiece from a starting location toward an ending location. During the scanning, one or more beam characteristics are monitored, such as beam current, beam flux, shape, and the like. An instability is detected when one or more of the beam characteristics deviate from acceptable values or levels. The ion beam is rapidly turned off on the detected instability. Other methods and systems are disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
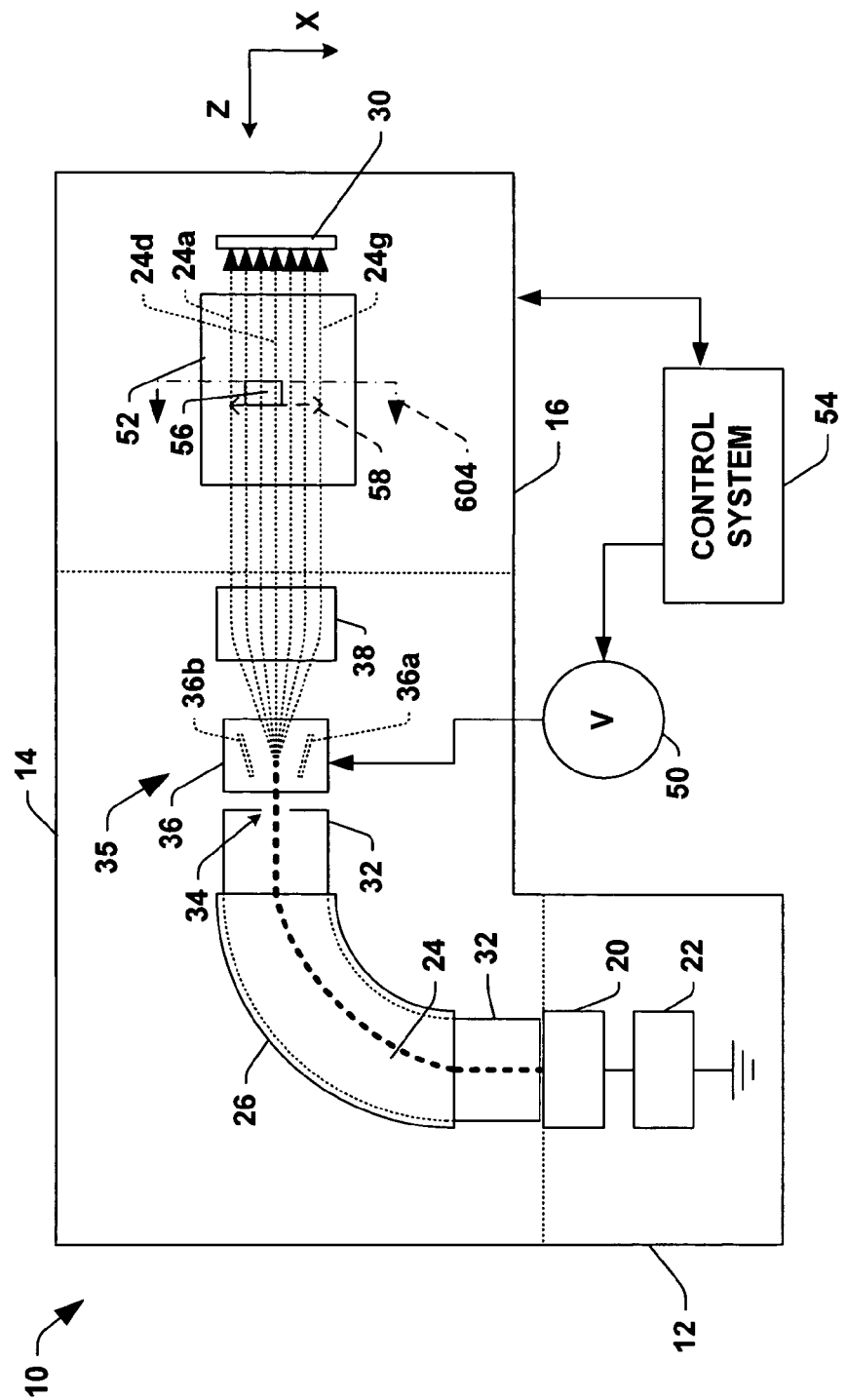
FIG. 1A is a diagram illustrating an exemplary ion implantation system with which one or more aspects of the invention can be employed.

The present invention will now be described with reference to the drawings wherein like reference numerals are used to refer to like elements throughout, and wherein the illustrated structures are not necessarily drawn to scale.

Aspects of the present invention facilitate ion implantation by detecting instabilities and performing repainting or recovery processes. As a result, non-uniform implantations, degradation of target workpieces and devices, and the like can be avoided and/or mitigated.

It is noted that the language "scanning an ion beam across a workpiece" merely implies relative motion of the ion beam with respect to the workpiece. Thus, it includes moving one or both of the ion beam and workpiece relative to each other. Example ion implantation systems are shown below that include several variations of scanning.

FIG. 1A is a diagram illustrating an exemplary ion implantation system 10 having a terminal 12, a beamline assembly 14, and an end station 16 with which one or more aspects of the invention can be employed. The system 10 is provided as an example for illustrative purposes and is not intended to limit aspects of the invention to only the system 10. Aspects of the present invention can be employed in accordance with other suitable ion implantation systems.

The terminal 12 includes an ion source 20 that produces and directs an ion beam 24 to the beamline assembly 14. The ion source 20 generates ions that are extracted from the source 20 and formed into the ion beam 24, which is directed along a beam path in the beamline assembly 14 to the end station 16.

The beamline assembly 14 has a beamguide 32, a mass analyzer 26 in which a dipole magnetic field is established to pass only ions of appropriate charge-to-mass ratio through a resolving aperture 34, a scanning system 35, and a parallelizer 38. The ion implantation system 10 may also include various beam forming and shaping structures extending between the ion source 20 and the end station 16, which maintain the ion beam 24 and bound an elongated interior cavity or passageway through which the beam 24 is transported to the workpiece 30 supported in the end station 16. This ion beam transport passageway is typically evacuated to reduce the probability of ions being deflected from the beam path through collisions with air molecules.

The implanter may employ different types of scanning systems. For example, electrostatic systems, shown, couple a high-voltage power supply to scan plates. The voltage on the plates is adjusted to scan the beam. In magnetic systems, a high current supply is connected to the coils of an electromagnet. The magnetic field is adjusted to scan the beam. For purposes of this invention, all different types of scanning systems are equivalent and the electrostatic system is used for illustration.

The scanning system 35 includes a scanner 36 and a power supply 50 coupled to scanner plates or electrodes 36a and 36b, where the scanner 36 receives a mass analyzed ion beam 24 along the beam path from the mass analyzer 26 and provides a scanned beam 24 along the beam path to a parallelizer 38. The parallelizer 38 then directs the scanned beam 24 to the end station 16 such that the beam 24 strikes measurement sensor(s) of the dosimetry system 52 at a generally constant angle of incidence.

The scanner 36 receives a mass analyzed ion beam 24 having a relatively narrow profile (e.g., a "pencil" beam in the illustrated system 10), and a voltage waveform applied by the power supply 50 to the scanner plates 36a and 36b operates to scan the beam 24 back and forth in the X direction (the scan direction) to spread the beam 24 out into an elongated "ribbon" beam (e.g., a scanned beam 24), having an effective X direction width that may be at least as wide as or wider than the workpieces of interest. The scanned beam 24 is then passed through the parallelizer 38 that directs the beam toward the end station 16 generally parallel to the Z direction (e.g., generally perpendicular to the workpiece surface).

The implanter 10 may employ different types of end stations 16. For example, "batch" type end stations can simultaneously support multiple workpieces 30 on a rotating support structure, wherein the workpieces 30 are rotated through the path of the ion beam until all the workpieces 30 are completely implanted. A "serial" type end station, on the other hand, supports a single workpiece 30 along the beam path for implantation, wherein multiple workpieces 30 are implanted one at a time in serial fashion, with each workpiece 30 being completely implanted before implantation of the next workpiece 30 begins.

The illustrated end station 16 is a "serial" type end station that supports a single workpiece 30 along the beam path for implantation (e.g., a semiconductor wafer, display panel, or other workpiece to be implanted with ions from the beam 24). A dosimetry system 52 can be situated near the workpiece location for calibration measurements prior to and during implantation operations. In one example, the dosimetry system 52 comprises one or more faraday cups that measure beam current or flux and are positioned downstream of the workpiece 30.

Figure 1B:
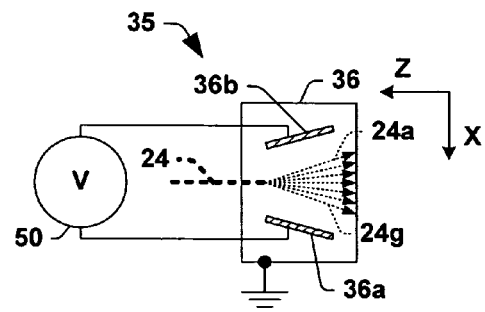
FIG. 1B is a diagram illustrating a scanner and several scanned ion beams.
Figure 1C:
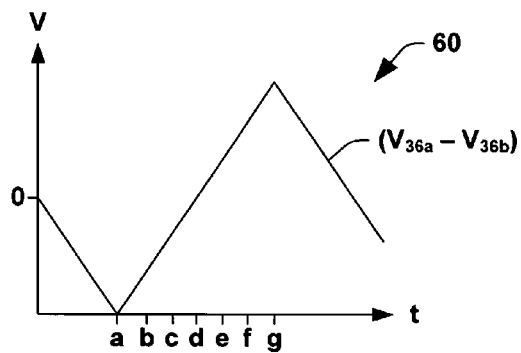
FIG. 1C is an example of a triangular scanning plate voltage waveform in the scanner of FIGS. 1A and/or 1B.

The electrostatic version of the beam scanner 36 is further illustrated in FIG. 1B, having a pair of scan plates or electrodes 36a and 36b on either lateral side of the beam path, and a voltage source 50 that provides alternating voltages to the electrodes 36a and 36b, as illustrated in a waveform diagram 60 in FIG. 1C. The time-varying voltage between the scan electrodes 36a and 36b creates a time varying electric field across the beam path there between, by which the beam 24 is bent or deflected (e.g., scanned) along a scan direction (e.g., the X direction in FIGS. 1A, 1B, and 2B-2F). When the scanner electric field is in the direction from the electrode 36a to the electrode 36b (e.g., the potential of electrode 36a is more positive than the potential of electrode 36b, such as at times "a" and "c" in FIG. 1C), the positively charged ions of the beam 24 are subjected to a lateral force in the negative X direction (e.g., toward the electrode 36b). When the electrodes 36a and 36b are at the same potential (e.g., zero electric field in the scanner 36, such as at time "d" in FIG. 1C), the beam 24 passes through the scanner 36 unmodified. When the field is in the direction from the electrode 36b to the electrode 36a (e.g., times "e" and "g" in FIG. 1C), the positively charged ions of the beam 24 are subjected to a lateral force in the positive X direction (e.g., toward the electrode 36a).

The control system 54 receives and monitors dosimetry information from the dosimetry system 52 during ion beam operation. The dosimetry information includes, for example, beam current, current density, and flux. On detecting an instability in the ion beam 24, a switching mechanism of the control system 54 is engaged to rapidly switch the ion beam 24 off. The switching mechanism can interact with the ion source 20, mass analyzer 26, and/or other components in order to rapidly switch the ion beam 24 off. The position on the workpiece where the beam 24 is switched off is recorded. Subsequently, the ion beam 24 is brought back into tolerance and a recovery procedure is initiated that recovers or repaints the scanning process on the workpiece 30 starting at the recorded position.

Figure 1D:
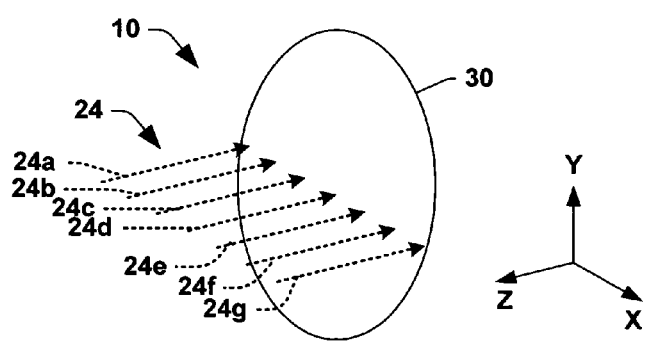
FIG. 1D is a perspective view illustrating one scanned ion beam striking a workpiece in the system of FIG. 1A at several discrete points in time.

FIG. 1B is a diagram that shows the scanned beam 24 deflection as it passes through the scanner 36 at several discrete points in time during scanning prior to entering the parallelizer 38. FIG. 1D illustrates the scanned and parallelized beam 24 impacting the workpiece 30 at the corresponding times indicated in FIG. 1C. The scanned and parallelized ion beam 24a in FIG. 1D corresponds to the applied electrode voltages at the time "a" in FIG. 1C, and subsequently, the beam 24b-24g is illustrated in FIG. 1D for scan voltages at corresponding times "b"-"g" of FIG. 1C for a single generally horizontal scan across the workpiece 30 in the X direction.

Figure 2A:
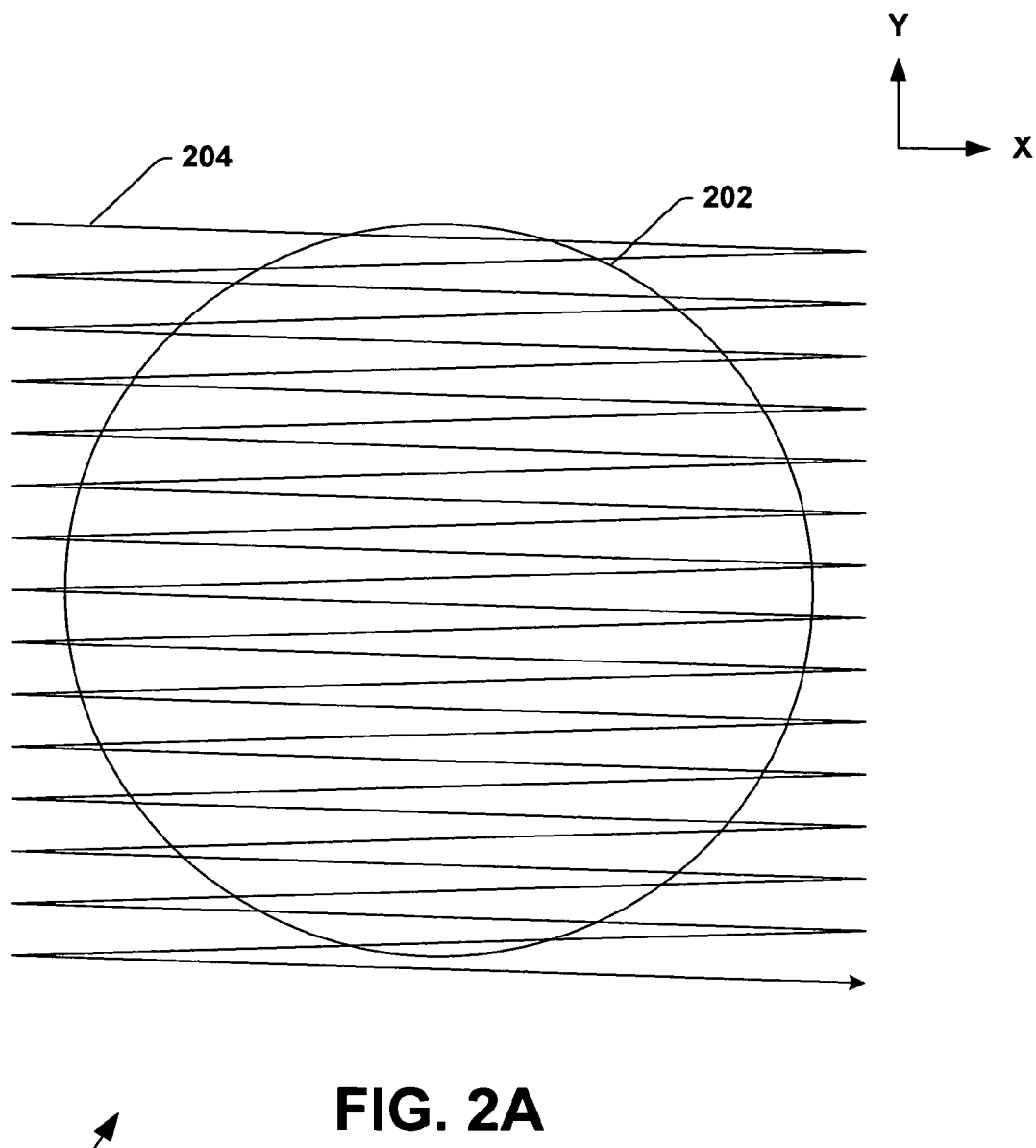
FIG. 2A is a diagram illustrating an example scan of an ion beam across a workpiece.

FIG. 2A is a diagram illustrating an example scan 200 of an ion beam 204 across the workpiece 202, wherein, as an example, mechanical actuation (not shown) translates the workpiece 202 in the positive Y (slow scan) direction during X (fast scan) direction scanning by a scanner, whereby the beam 204 is imparted on the entire exposed surface of the workpiece 202.

Prior to entering the scanner, the ion beam 204 typically has a width and height profile of non-zero X and Y dimensions, respectively, wherein one or both of the X and Y dimensions of the beam typically vary during transport due to space charge and other effects. For example, as the beam 204 is transported along the beam path toward the workpiece 202, the beam 204 encounters various electric and/or magnetic fields and devices that may alter the beam width and/or height or the ratio thereof. In addition, space charge effects, including mutual repulsion of positively charged beam ions, tend to diverge the beam (e.g., increased X and Y dimensions), absent countermeasures.

The example scan 204 results in a uniform implantation when the beam current remains constant across the fast scan and the Y height of the beam is larger than roughly ⅓ the wafer height.

Figure 2B:
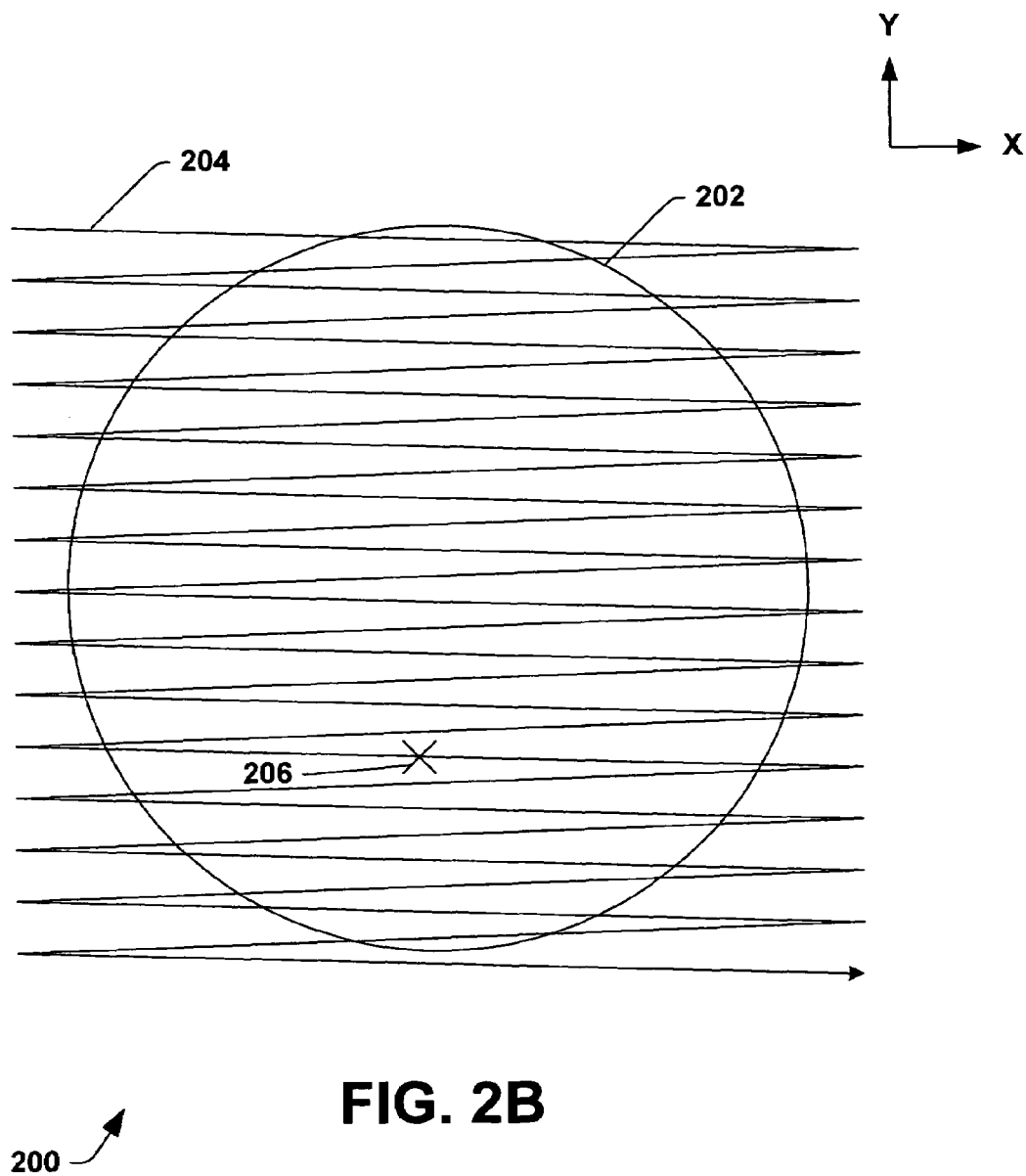
FIG. 2B is another diagram illustrating another example scan of an ion beam across a workpiece.

FIG. 2B is another diagram illustrating another example scan 200 of an ion beam 204 across a workpiece 202. The scan 200 is similar to that shown in FIG. 2A and depicts the ion beam 204 being scanned across the workpiece 202. However, the scan 200 of FIG. 2B has a detected instability 206, which can be detected by monitoring/measuring beam current at or about the workpiece 202. In one example, the instability 206 can be detected by a measured beam current variation of about 5 percent.

Unfortunately, the ion beam 204 remains on through the instability 206 and a corresponding portion of the workpiece 202 receives a non-uniform dose.

Figure 2C:
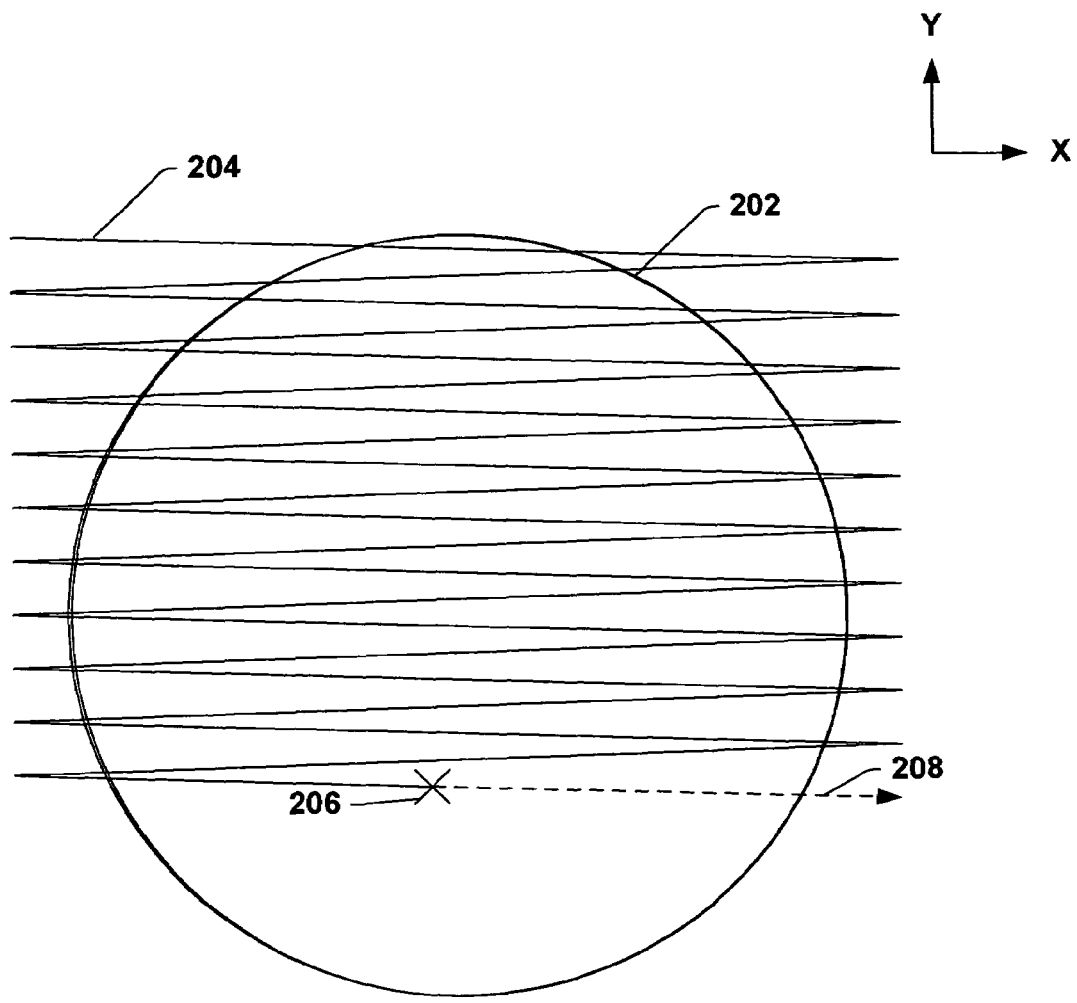
FIG. 2C is yet another diagram illustrating an example scan of an ion beam across a workpiece in accordance with an aspect of the present invention.

FIG. 2C is yet another diagram illustrating an example scan 200 of an ion beam 204 across a workpiece 202 in accordance with an aspect of the present invention. The scan 200 is similar to that shown in FIGS. 2A and 2B and depicts the ion beam 204 being scanned across the workpiece 202 from a starting position toward an ending position. As in FIG. 2B, the scan 200 of FIG. 2C has a detected instability 206, which can be detected by monitoring/measuring beam current at or about the workpiece 202. In one example, the instability 206 can be detected by a measured beam current variation of about 5 percent from a return current monitor.

In accordance with one or more aspects of the invention, the ion beam 204 is rapidly switched off on detecting the instability 206. As a result, a corresponding region of the workpiece 202 does not receive a non-uniform dose. The position on the wafer corresponding to the detected instability in the beam is referred to as an off position and can be recorded or stored for a subsequent recovery/repaint process.

Subsequently, the ion beam 204 can be stabilized and a rescan or repaint can be performed so as to provide a uniform does to the corresponding region and other portions of the device. The repaint/recovery process, in one example, starts at the ending position of the scan and continues until reaching the beam-off position.

One example of a suitable rescan or repaint technique is described in Foad et al., U.S. patent application Ser. No. 11/029,646, filed Jan. 6, 2005, which is hereby incorporated by reference in its entirety.

Figure 3:
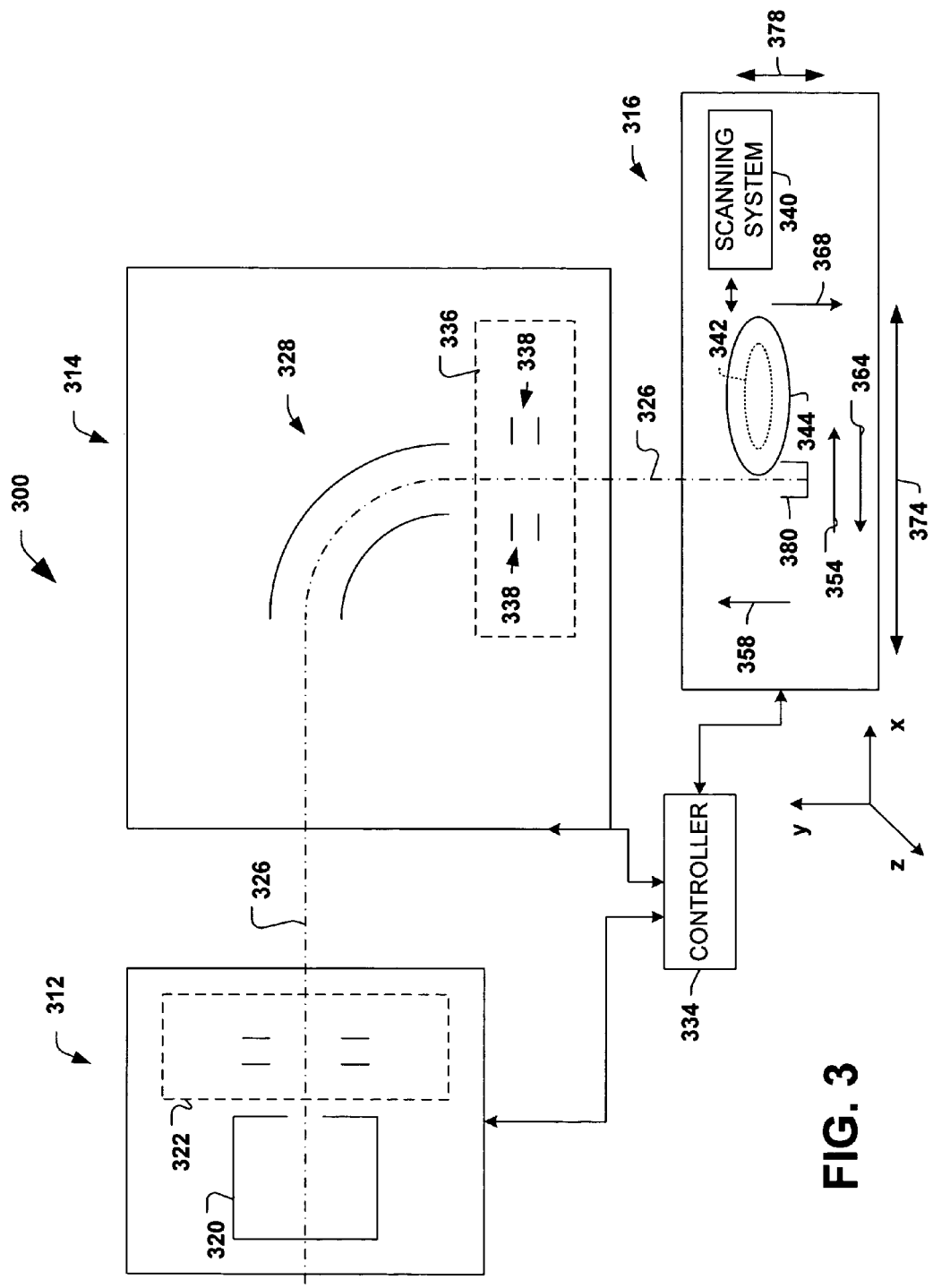
FIG. 3 illustrates another exemplary ion implantation system suitable for implementing one or more aspects of the present invention.

FIG. 3 illustrates another exemplary ion implantation system 300 suitable for implementing one or more aspects of the present invention. The system 300 is also provided as an example for illustrative purposes. The system 300 employs a fixed beamline and a two dimensional wafer scanning motion of the workpiece 344.

The implantation system 300 includes an terminal 312, a beamline assembly 314, and a target or end station 316. The terminal 312 produces and directs an ion beam 326 to the beamline assembly 314. The terminal 312 includes a source 320 that generates ions that are extracted by extraction electrodes 322 and formed into the ion beam 326 and directed along a beam path in the beamline assembly 314 to the end station 316.

Within the beamline assembly 314, a mass analyzer 328 performs mass analysis on the ion beam 326 to remove non-selected ions according to a selected charge-to-mass ratio. As the beam 326 enters the mass analyzer 328, it is correspondingly bent by a magnetic field such that ions of an inappropriate charge-to-mass ratio are rejected. Control electronics or a controller 334 can be included to adjust the strength and orientation of the magnetic field, among other things. The magnetic field can, for example, be controlled by regulating the amount of electrical current running through field windings of the magnet 328. It will be appreciated that the controller 334 may include a programmable micro-controller, processor and/or other type of computing mechanism for overall control of the system 300 (e.g., by an operator, previously and/or presently acquired data and/or programs).

The beamline assembly 314 may also include an accelerator 336, for example, that comprises a plurality of electrodes 338 arranged and biased to accelerate and/or decelerate ions, as well as to focus, bend and/or decontaminate the ion beam 326. Further, it will be appreciated that ion beam collisions with other particles degrade beam integrity so that the entire beamline assembly 314 from the source 312 to the end station 316, including the mass analysis magnet 328, may be evacuated by one or more pumps (not shown). Downstream of the accelerator 336 is the end station 316 which receives the mass analyzed ion beam 326 from the beamline assembly 314. The end station 316 includes a two dimensional scanning system 340 that may comprise a support or end effector 342 upon which a workpiece 344 to be treated is mounted for selective movement thereby. The end effector 342 and workpiece 344 reside in a target plane that is generally perpendicular to the direction of the ion beam 326.

The workpiece 344 is moved (e.g., via the end effector 342) back and forth in directions 354, 364 along a first or "fast" scan path 374 (e.g., along the x-axis). The workpiece 344 is also moved through slow scan directions 358 or 368 along a second or "slow" scan path 378 (e.g., along the y-axis) as the workpiece 344 oscillates along the first scan path 374. In this manner, a scan pattern produced thereby can cover and/or approximate the shape of the workpiece 344. By way of example, in the system 300 illustrated in FIG. 3, the workpiece 344 has just completed a fast scan in direction 354, and is thus ready to be moved back through fast scan direction 364 (e.g., once the workpiece 344 has been indexed along the slow scan path 378).

The respective ranges of motion of the workpiece 344 along the first scan path 374 may be a function of the orientation of the workpiece 344 relative to the ion beam 326 as well as the size, shape and/or other dimensional data of the workpiece 344 and/or the ion beam, for example. The controller 334 may, for example, utilize such orientation data and dimensional data to control the selective movement of the workpiece 344. For example, the respective ranges of motion of the workpiece 344 along the fast scan path 374 may be controlled (e.g., by the controller 334) to slightly exceed the respective sizes of the portions of the workpiece 344 being scanned during the respective oscillations so that the workpiece 344 is not impinged upon by the ion beam while the workpiece is changing directions and/or moving along the second scan path 378. In this manner, respective overshoots can be said to exist for the different oscillations. Such overshoots can, for example, be made large enough to accommodate inertial effects that are inevitable when the workpiece 344 changes direction and/or velocity.

A measurement component 380 (e.g., a Faraday cup) may also be incorporated into the end station 316. The measurement component 380 may be operative to detect beam current, for example, and may be situated behind the workpiece 344 (e.g., so as to not interfere with the ion implantation process). A detected level of beam current can, for example, be utilized to identify the end of a scan.

The controller 334 receives measurement information from the measurement component 380 and can detect instability in the ion beam 326. On detecting an instability, a switching mechanism of the controller 334 is engaged to rapidly switch the ion beam 326 off. The switching mechanism can interact with the ion source 320, the mass analyzer 328, and/or other components in order to rapidly switch the ion beam 326 off. The position of the target workpiece 342 where the ion beam 326 is switched off is recorded. Thereafter, the ion beam 326 is brought back into tolerance and a recover procedure is initiated that recovers or repaints the scanning process on the workpiece 342 starting at the recorded position.

One example of a two dimensional scanning ion implantation system is described in Graf et al., U.S. Pat. No. 6,953,942, filed Sep. 20, 2004 and entitled ION BEAM UTILIZATION DURING SCANNED ION IMPLANTATION, which is hereby incorporated by reference in its entirety.

Figure 4A:
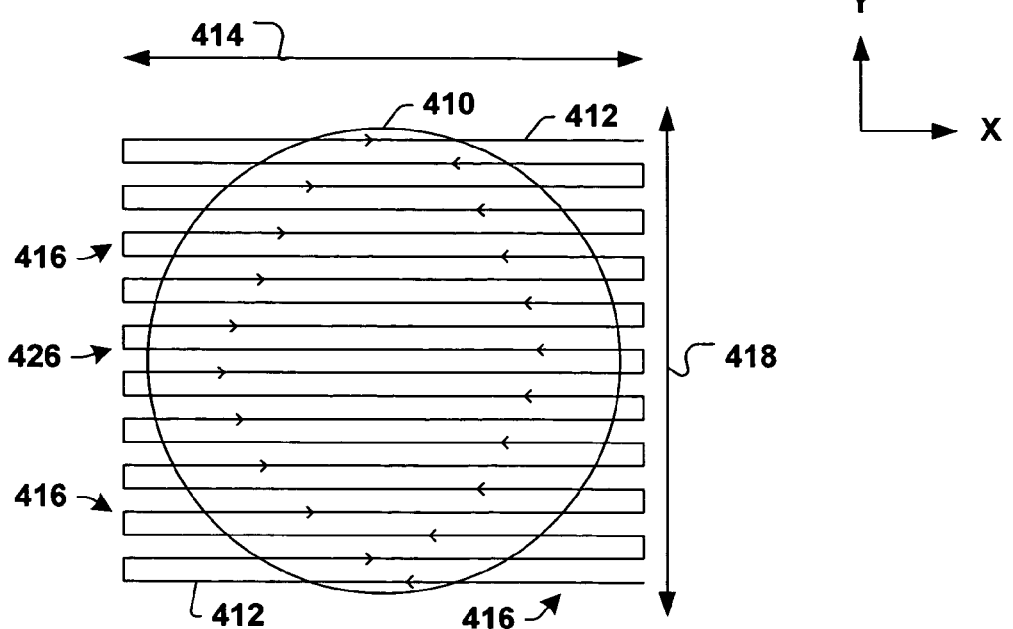
FIG. 4A is a diagram illustrating another example scan of an ion beam across a workpiece.

FIG. 4A is a diagram illustrating another example scan 412 of an ion beam across a workpiece 410. The scan 412 can be generated, for example, by the ion implantation system 300 described in FIG. 3 above having a fixed ion beam and two dimensional movement of the workpiece 410.

The scan pattern 412 is created by scanning an ion beam back and forth along a first or "fast" scan path 414, where the fast scan path 414 corresponds to a widest portion 426 of the workpiece 410 plus some overshoot 416. The overshoot 416, in turn, corresponds to instances where the beam is scanned past the workpiece 410 and therefore no longer impinges on the workpiece 410. The beam is also moved along a second or "slow" scan path 418 as the beam oscillates along the first scan path 414. It can be appreciated that the scan pattern 412 is basically independent of the size and/or shape of the workpiece 410 in that only the widest portion 426 of the workpiece 10 is considered so that the scan pattern 412 is large enough to cover this widest portion 426 of the workpiece 410.

Figure 4B:
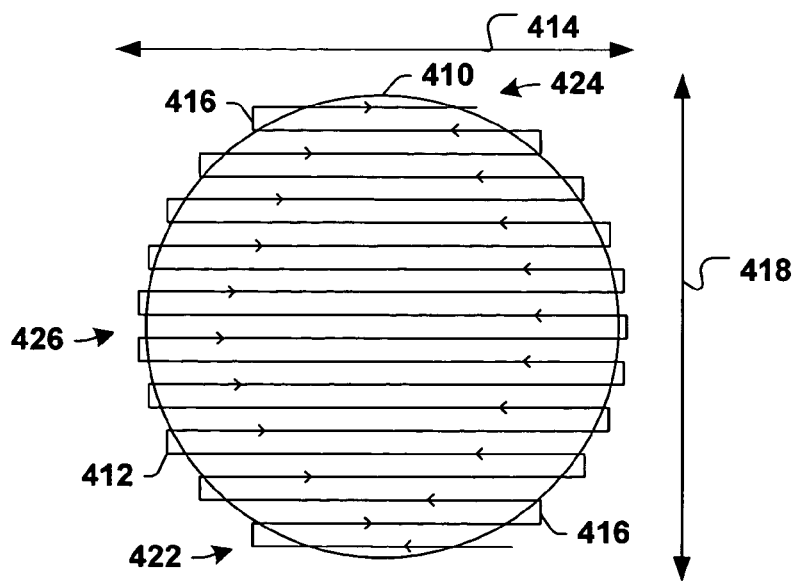
FIG. 4B is a diagram illustrating yet another example scan of an ion beam across a workpiece.

FIG. 4B is a diagram illustrating yet another example scan of an ion beam across a workpiece 410. A scan pattern 412 shown here, resembles the size and/or shape of the workpiece 410. More particularly, the workpiece 410 is controllably moved through respective ranges of motion along a first or fast scan path 414, where the ranges of motion correspond to respective sizes of the workpiece 410 being scanned during respective oscillations along the first scan path 414. In the illustrated example, the workpiece is also indexed one increment along a second or slow scan path 418 between respective oscillations along the first scan path 414. As such, overshoot 416 can be reduced.

Detected instabilities and recovery/repainting procedures can be performed with such scans similar to those described with the scans shown in FIGS. 2A, 2B, and 2C and described above.

Figure 5:
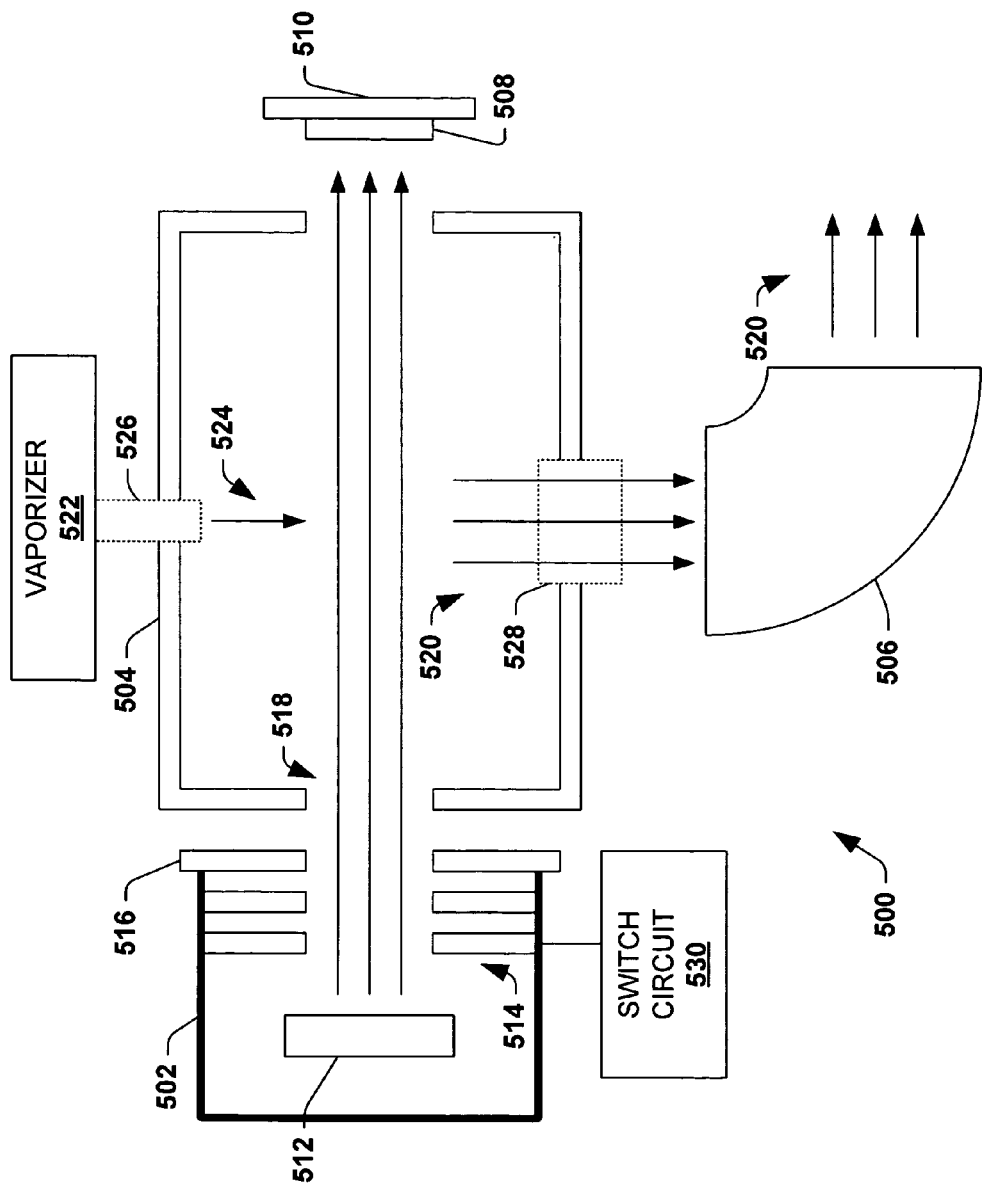
FIG. 5 is a diagram illustrating an electron gun based ion implantation system in accordance with an aspect of the present invention.

FIG. 5 is a diagram illustrating an electron gun based ion implantation system 500 in accordance with an aspect of the present invention. The system 500 is provided as an example of a non-arc discharge ion source based system.

The system 500 includes an electron gun 502, an ionization chamber 504, a mass analyzer 506, a beam dump 508, and a vaporizer 522. The electron gun 502 generates a directed steam of energetic electrons as an electron beam 518 toward an entrance aperture of the ionization chamber 504. The vaporizer 522 provides a vapor or gas to the ionization chamber 504. The electrons 518 impact the vapor or gas and ionize materials within the vapor or gas to form a plasma (not shown). The electron beam 518 exits the chamber 504 via an exit aperture and impacts the beam dump 508. The ion beam 520 is extracted from the plasma with an extraction system (not shown) via an ion exit aperture 528 toward the mass analyzer 506. The mass analyzer 506 passes only those ions within the beam 520 that have a selected charge-to-mass ratio. The ion beam 520, now mass analyzed, is directed by the mass analyzer 506 toward the target workpiece and ion implantation can occur.

The electron gun 502 comprises a cathode 512, and electron optics 514, and a source shield 516. An anode 510 is positioned about the beam dump 508. The cathode 512 is maintained at an electrical potential below the ionization chamber 504 and generates the electron beam 518. The electron optics 514 can focus and form the electron beam to a selected size and shape, such as a relatively wide ribbon beam. The electron optics 514 operate by selectively applying voltages such that the selected size and shape is obtained. The source shield 516 mitigates heat load to the ionization chamber 504 and, in one example, is comprised of a water-cooled sheet metal assembly.

The vaporizer 522 vaporizes solid materials that have relatively high vapor pressures at moderate temperatures, such as about 100 C. The vaporizer 522 provides the vapor or gas to the ionization chamber 504 at a flow rate dependent upon vaporizer 522 temperature. Gas feed lines 526 can be employed to transport the gas from the vaporizer 522 to the ionization chamber 504, however other transport mechanisms can be employed. It is also possible to operate this type of source without a vaporizer, using gaseous feed materials directly.

The ionization chamber 504 is where the gas(es) are fed and ionized by electron impact. A plasma is generated within the ionization chamber 504 as a result of the impact of the gas and electrons. In one example, the ionization chamber 504 is rectangular shaped and comprised of a machined material, such as aluminum or graphite. The chamber 504 includes the entrance aperture near the electron gun 502 that receives the electron beam 518 and the electron exit aperture on an opposite end and downstream of the entrance aperture. The ion exit aperture 528 provides the ion beam 520. The flow rate of the gas into the ionization chamber 504 is provided at a sufficient level to maintain proper feed gas pressure within the chamber 504.

The mass analyzer 506 can include electromagnets, permanent magnets, or a combination thereof. The mass analyzer 506 generates a magnetic field that bends a path of the ion beam 520 such that selected ions/dopants having a selected charge-to-mass ratio pass there through. Other particles and/or non selected ions/dopants are blocked and exit the beam 520.

Aspects of the present invention include a number of techniques for rapidly turning the ion beam 520 off with respect to a target wafer or workpiece, typically in response to a detected instability. The ion beam 520 can then be turned back on and a repaint or recover process performed.

One technique is to employ a switch circuit 530 to rapidly disconnect or alter applied voltages to the electron optics 514. The switch circuit 530 can disconnect or alter the applied voltages to the electron optics 514 in order to prevent the electron beam 518 from being formed. Without the electron beam 518, the ion beam 520 does not form. Alternately, the bias voltage applied to the cathode 512 can be altered to stop formation of the electron beam 518. In another example, flow of the gases 524 from the vaporizer 522 is halted to prevent ion beam formation.

An example of a suitable electron gun ion implantation system, which can be employed with the present invention, is described in Horsky, U.S. Pat. No. 6,452,338, granted Sep. 17, 2002, which is hereby incorporated by reference in its entirety.

Figure 6:
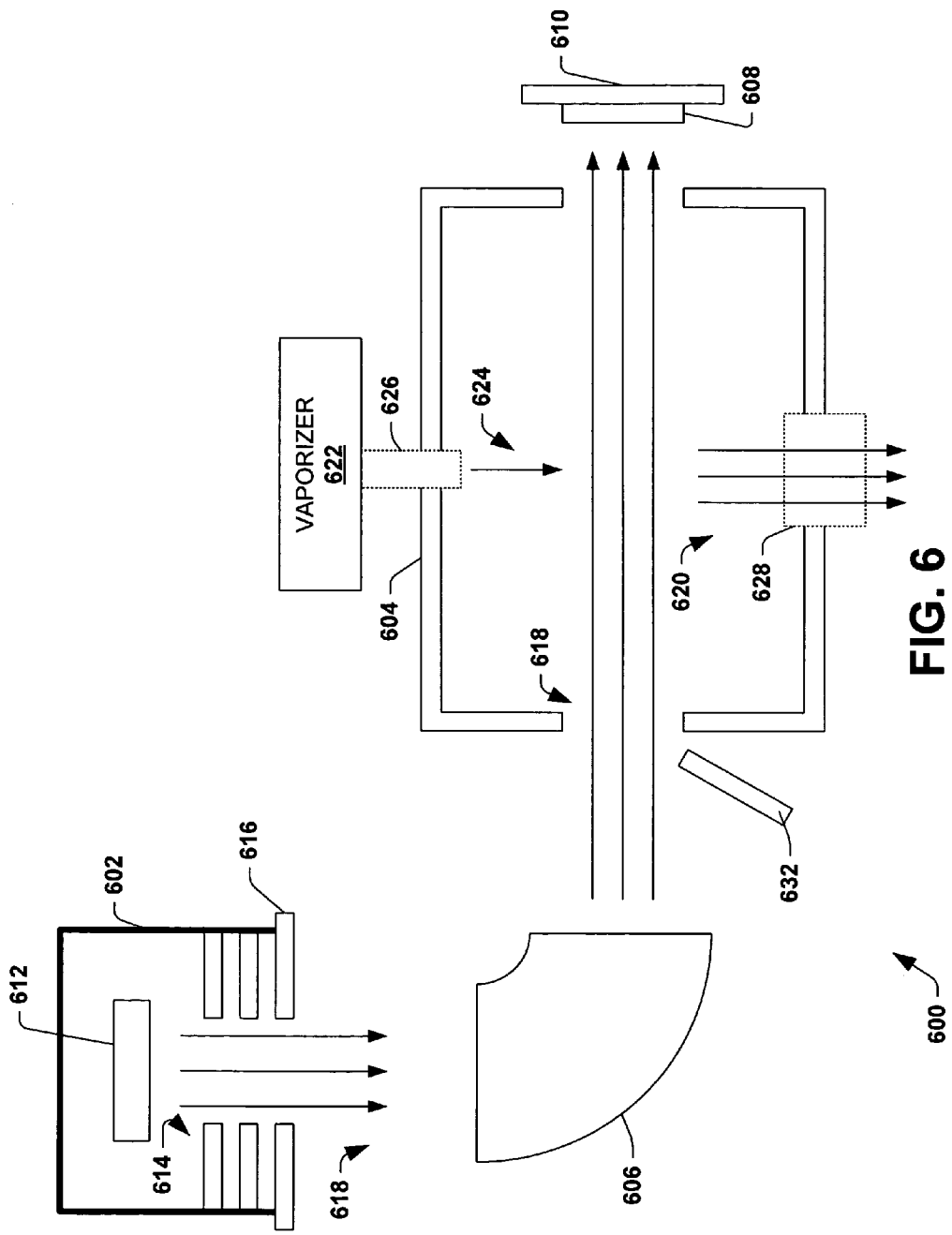
FIG. 6 is a diagram illustrating an electron gun based ion implantation system in accordance with an aspect of the present invention.

FIG. 6 is a diagram illustrating an electron gun based ion implantation system 600 in accordance with an aspect of the present invention. The system 600 is provided as an example of a non-arc discharge ion source based system. The system 600 operates in a similar manner to that of the system 500 shown in FIG. 5. However, the system 600 includes a bending magnet 606 that selectively directs the electron beam 618 into the ionization chamber. The above description of FIG. 5 can be referenced for additional details.

The system 600 includes an electron gun 602, an ionization chamber 604, a bending magnet 606, a beam dump 608, and a vaporizer 622. The electron gun 602 generates a directed steam of energetic electrons as an electron beam 618. The bending magnet 606 alters a path of the electron beam 618 toward the ionization chamber 604 and an entrance aperture of the ionization chamber 604. The vaporizer 622 provides a source material, such as a vapor or a gas, to the ionization chamber 604. The electrons 618 impact the source material and ionize materials within the source material to form a plasma (not shown), from which an ion beam 620 can be extracted there from. The electron beam 618 exits the chamber 604 via an exit aperture and impacts the beam dump 608. The ion beam 620 exits the ionization chamber 604 via an ion exit aperture Aspects of the present invention include a number of techniques for rapidly turning the ion beam 620 off with respect to a target wafer or workpiece, typically in response to a detected instability. The ion beam 620 can then be turned back on and a repaint or recover process performed.

In one technique, an anode voltage of the electron gun 602 is changed to alter the path of the electron beam 618 through the bending magnet 606. The deflected electron beam 618 can be redirected to an additional beam dump 632. In another technique, the bending magnet 606 is comprised of an electromagnet. The current through the electromagnet can be rapidly altered to change the path of the electron beam 618 and redirected to the additional beam dump 632. As another example, a bias voltage applied to the cathode 312 can be altered to redirect the electron beam 618 toward the additional beam dump 632. Other suitable techniques can be employed.

Figure 7:
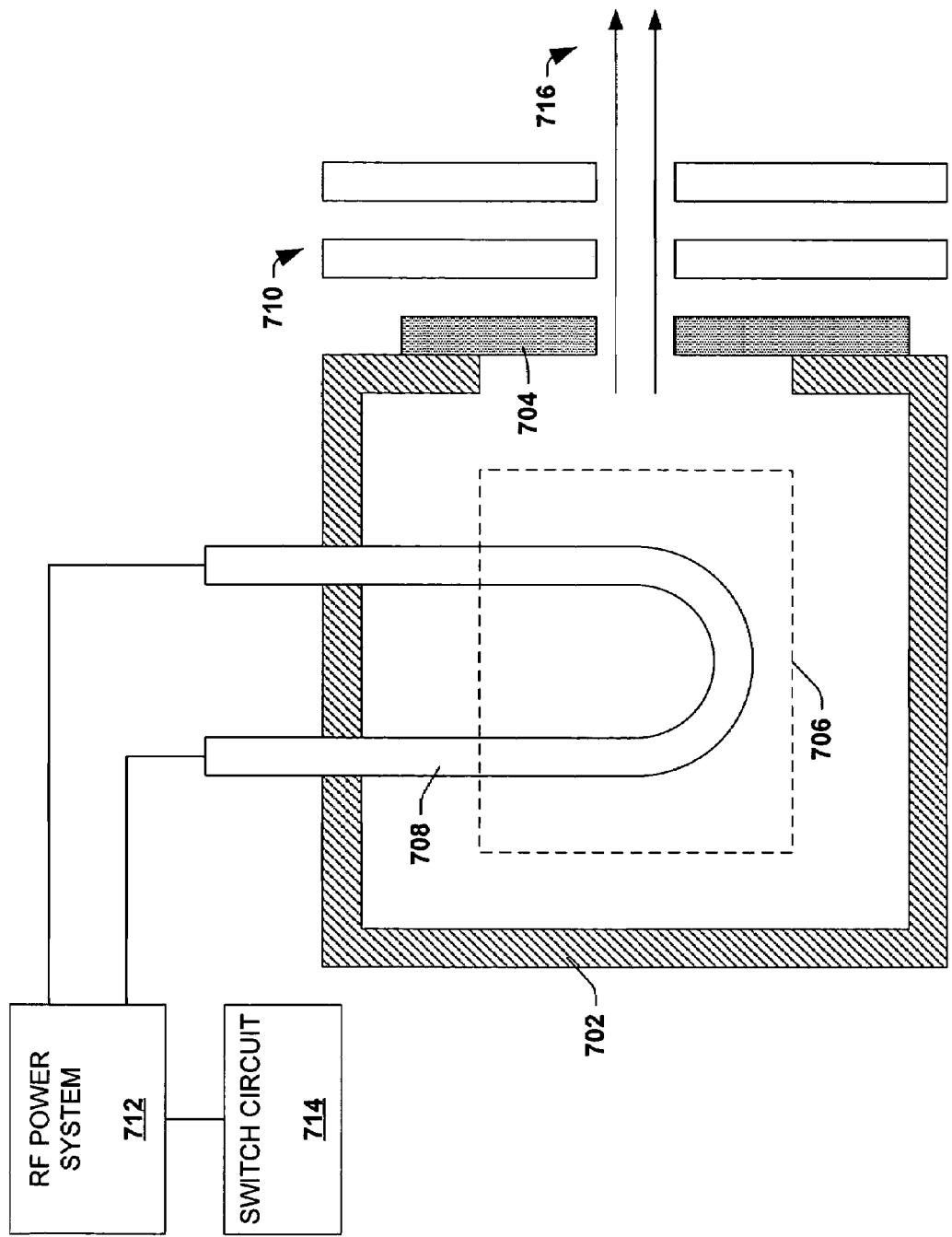
FIG. 7 is a diagram illustrating an ion source in accordance with an aspect of the present invention.

FIG. 7 is a diagram illustrating an RF ion source 700 in accordance with an aspect of the present invention. The ion source 700 is configured so that the source 700 can be rapidly turned off to terminate ion beam generations.

The ion source 700 includes a plasma chamber 702 that defines an ionization zone 706. The plasma chamber 702 typically has conductive walls that bound the ionization zone 706. An aperture plate 704 is positioned along one of the walls of the plasma chamber 702. The aperture plate 704 selectively allows ions to pass through an opening/aperture therein. Suppression/extraction electrodes 710 are positioned downstream of the aperture plate 704 and form the ions into an ion beam 716.

Source materials are contained within the ionization zone 706, for example, in a form of a gas or vaporized source material. The source material is routed into the ionization zone 706 from a source external to the chamber 702. A metallic antenna 708 is positioned within the chamber 702 and has leads or portions outside the chamber 702. The metallic antenna 708 emits energy into the ionization zone 706 to encourage ionization of the source materials therein. An rf power system 712 is connected to the antenna 708. The power system 712 provides the energy/power to the metallic antenna 708 to encourage the ionization. The rf power system 712, in one example, can contain a low power oscillator and one or more stages of amplification, or, in another example, it can contain a high power oscillator. In addition, the rf power system 712 can contain a matching circuit to properly condition the rf power to match the load characteristics of the antenna 708. The switch circuit 714 is configured to enable rapid turn off of the rf power. For example, in the case where the rf power system 712 contains a high power oscillator, the switch circuit 714 may change the dc bias on a circuit element, e.g., the grid of a triode or the gate of a FET, to stop the oscillation. In the case where the rf power system 712 contains one or more stages of amplification, the switch circuit 714 may, e.g., remove the dc power from one or more stages of amplification, reducing the gain, and therefore the rf power, to zero.

During operation, the source materials are ionized by energy from the antenna 708 within the ionization zone 706. The ions can only exit the chamber 702 via the aperture of the aperture plate 704. The suppression electrodes 710 are biased with selected values and form the exited ions into the ion beam 716.

If an instability is detected, such as a variation in beam current or flux, the switch circuit 714 reduces the output power of the rf power system 712 to zero. As a result, ionization of the source materials halts and, therefore, so does generation of the ion beam 716. The ion beam 716, in one example, can then be directed away from a target wafer or workpiece before being switched on again. At this point, the switch circuit 714 operates to increase the output power of the rf power system 712 to the level existing before the instability, permitting power to the antenna 708 and permitting generation of the ion beam 716. A repainting and/or recovery procedure can then continue.

Figure 8:
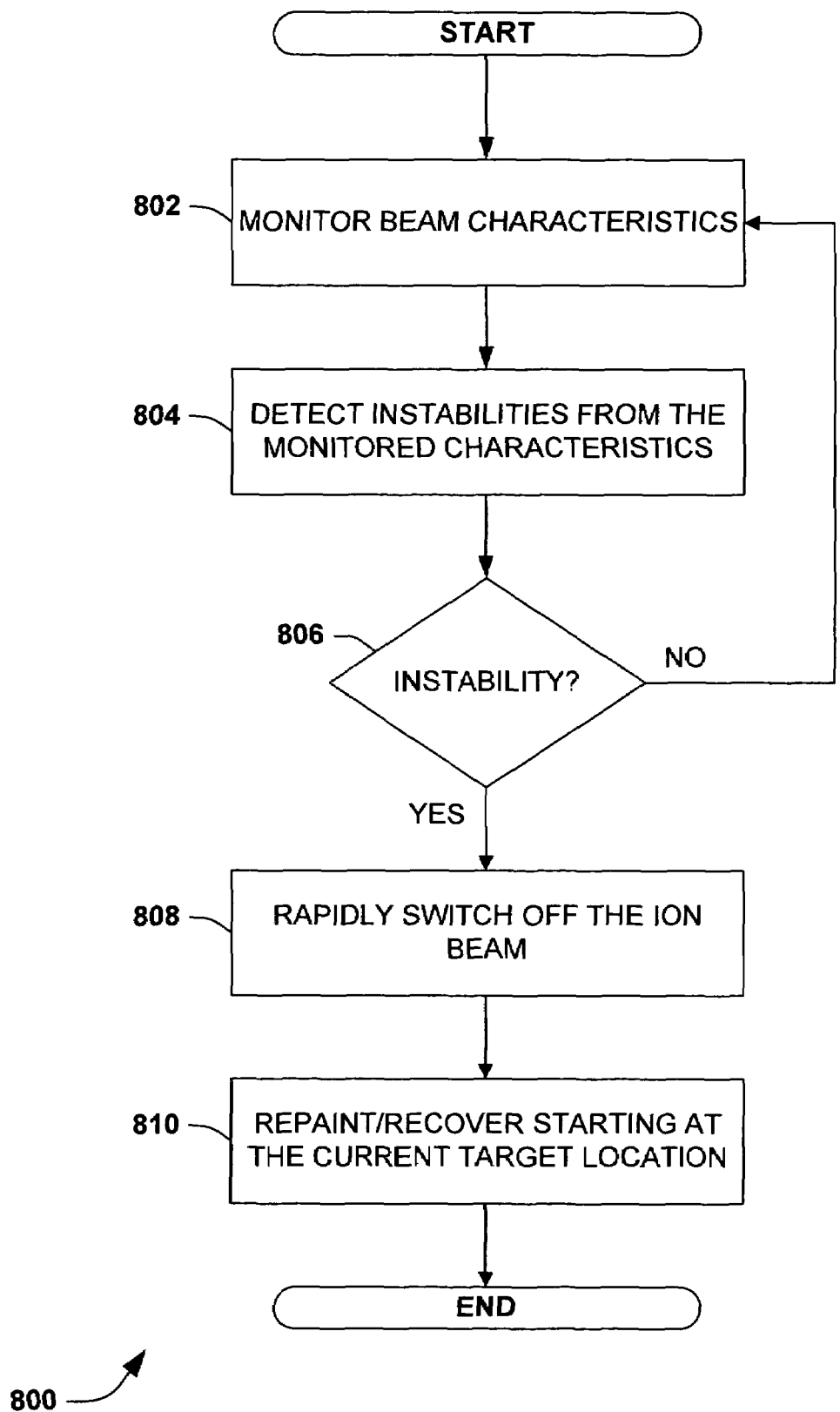
FIG. 8 is a flow diagram illustrating a method of operating an ion beam system in accordance with an aspect of the present invention.

FIG. 8 is a flow diagram illustrating a method 800 of operating an ion beam system in accordance with an aspect of the present invention. The method 800 operates with non-arc discharge ion sources in order to mitigate non-uniform implantations or dosimetry for target workpieces. The above figures and descriptions can be referenced for additional details for the method 800.

The method 800 begins at block 802 wherein characteristics of an ion beam are monitored during a scanning based ion implantation. The characteristics can include, for example, beam current, current uniformity, flux, dosimetry, power supplies for electrodes and scanning systems, and the like. In one example, a faraday cup is positioned about a target workpiece to measure beam current. In another example, a return current monitor is employed to measure beam current. Examples of suitable current monitors are described in Foad et al., U.S. patent application Ser. No. 11/029,646, filed Jan. 8, 2005, which is hereby incorporated by reference in its entirety. Other suitable measuring techniques can be employed.

The ion beam is generated or provided by a non-arc discharge based ion source, such as an electron gun ion source or an RF ion source and beam characteristics of the ion beam are monitored at block 802. The ion implantation, in this aspect, includes scanning the ion beam relative to the target workpiece one or more times to perform ion implantation and provide adequate coverage. It is noted that scanning the ion beam across or relative to the workpiece includes moving the ion beam and/or the workpiece.

Instabilities are detected at block 804 for the ion beam when one or more of the characteristics are outside of acceptable ranges or values. For example, a beam current variance beyond a selected percentage can be employed to detect an instability.

On a detected instability at 806, the ion beam is rapidly switched off at block 808. This mitigates a non-uniform implant at a current target region on the workpiece. The switching off of the ion beam occurs before substantial implantation at the current target region can occur. The current target region can be recorded or stored for a subsequent repaint process as a beam-off position.

Generally, the ion beam can be turned off by switching off the non-arc discharge ion source and/or deflecting the ion beam. For example, an RF ion source can be rapidly switched off by turning off the power supply connected to its antenna. As a result, ionization of the plasma and, therefore, generation of the ion beam is switched off. As another example, an electron beam of an electron gun ion source can be redirected toward an additional beam dump such that interaction between the electron beam and a source material, such as a vapor or gas, within an impact ionization chamber does not occur, which switches off the ion beam. Other examples of switching off the ion beam are described above and can be referenced for additional details. A target of the ion beam can be directed away from the current target region and off of the workpiece by a scanning system after switching off the ion beam.

A repainting or recovery process is then performed at block 810 that continues scanning at the current target region or location. The ion beam is again switched on while off of the wafer in order to stabilize the beam. The ion beam is monitored until the one or more measured characteristics are brought to acceptable levels or values. Thereafter, the entire workpiece completes the scan process and obtains a relatively uniform ion implantation.

Although the invention has been illustrated and described with respect to one or more implementations, alterations and/or modifications may be made to the illustrated examples without departing from the spirit and scope of the appended claims. In particular regard to the various functions performed by the above described components, or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method of implanting ions, the method comprising:
providing an ion beam by a non-arc discharge ion source;
scanning the ion beam across a workpiece;
measuring one or more characteristics of the ion beam, wherein measuring the one or more characteristics includes measuring a shape of the ion beam;
detecting an instability from the one or more measured characteristics; and
rapidly switching off the ion beam after detecting the instability.

2. The method of claim 1, wherein rapidly switching off the ion beam comprises turning off a non-arc discharge ion source.

3. The method of claim 1, wherein rapidly switching off the ion beam comprises preventing implantation at a current target location of the workpiece.

4. The method of claim 3, further comprising recording the current target location.

5. The method of claim 1, wherein measuring the one or more characteristics further comprises measuring beam current.

6. The method of claim 1, wherein measuring the one or more characteristics further comprises measuring flux.

7. The method of claim 1, wherein measuring the one or more characteristics further comprises employing a return current monitor.

8. The method of claim 1, wherein scanning the ion beam across the workpiece includes initiating scanning at a starting location and continuing toward an ending location.

9. A method of implanting ions, the method comprising:
providing an ion beam by a non-arc discharge ion source;
scanning the ion beam across a workpiece along a scan path in a first direction from a starting location to an ending location;
measuring one or more characteristics of the ion beam, wherein measuring the one or more characteristics includes measuring a share of the ion beam;
detecting an instability of the ion beam from the one or more measured characteristics;
rapidly switching off the ion beam at a beam-off position on the workpiece after detecting the instability; and
repainting an unscanned portion of the workpiece along the scan path, wherein repainting comprises stabilizing the ion beam clear of the workpiece and rescanning the ion beam across the workpiece starting at the ending location and moving toward the beam-off position on the workpiece along the scan path in a second direction, wherein the second direction is opposite of the first direction.

10. The method of claim 1, wherein providing the ion beam comprises supplying power to an RF ion source.

11. The method of claim 10, wherein rapidly switching off the ion beam comprises switching off power to the RF ion source.

12. The method of claim 1, wherein scanning the ion beam across the workpiece comprises moving the workpiece relative to the ion beam, wherein the ion beam is stationary.

13. A method of implanting ions, the method comprising:
generating an electron beam toward an ionization chamber comprising deflecting the electron beam toward the ionization chamber by a magnet;
providing a source material into the ionization chamber;
generating an ion beam from an interaction between the electron beam and the source material;
scanning the ion beam across a workpiece from a starting position toward an ending position;
measuring beam current of the ion beam; and
on detecting an instability, rapidly switching off the ion beam at a current position of the workpiece.

14. The method of claim 13, wherein rapidly switching off the ion beam comprises redirecting the electron beam away from the ionization chamber by the magnet.

15. A method of implanting ions, the method comprising:
generating an electron beam toward an ionization chamber;
providing a source material into the ionization chamber;
generating an ion beam from an interaction between the electron beam and the source material;
scanning the ion beam across a workpiece from a starting position toward an ending position;
measuring beam current of the ion beam and measuring beam shape of the ion beam for identifying instabilities; and
on detecting an instability, rapidly switching off the ion beam at a current position of the workpiece.

16. The method of claim 13, wherein providing the source material comprises providing a vapor or gas.

17. A method of implanting ions, the method comprising:
generating an ion beam with an RF ion source;
scanning the ion beam across a workpiece from a starting position toward an ending position;
measuring beam current and ion beam shape during scanning of the ion beam and evaluating the measured beam current and ion beam shape for purposes of detecting an instability of the ion beam based thereon; and
on detecting an instability, rapidly switching off the ion beam at a current position of the workpiece.

18. The method of claim 17, further comprising switching off power to an antenna within a plasma chamber of the RF ion source to halt ionization and generation of the ion beam.

19. The method of claim 17, further comprising stabilizing the beam and re-scanning the workpiece from the end position toward the current position after rapidly switching off the ion beam.

* * * * *